United States Patent
Kida et al.

(12) 
(10) Patent No.: US 6,440,278 B1
(45) Date of Patent: *Aug. 27, 2002

(54) TARGET AND PROCESS FOR ITS PRODUCTION, AND METHOD FOR FORMING A FILM HAVING A HIGH REFRACTIVE INDEX

(75) Inventors: Otojiro Kida; Akira Mitsui; Eri Suzuki; Hisashi Osaki; Atsushi Hayashi, all of Yokohama (JP)

(73) Assignee: Asahi Glass Company Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/964,625

(22) Filed: Sep. 28, 2001

Related U.S. Application Data

(62) Division of application No. 09/729,102, filed on Dec. 5, 2000, now Pat. No. 6,334,938, which is a continuation of application No. 09/011,749, filed as application No. PCT/JP96/00767 on Mar. 25, 1996, now Pat. No. 6,193,856.

(30) Foreign Application Priority Data

Aug. 23, 1995 (JP) .............................. 7-215074

(51) Int. Cl.⁷ ........................... C23C 14/34; C23C 4/10; C22C 27/02; B05D 1/36
(52) U.S. Cl. ........................... 204/192.22; 204/298.13; 420/425; 148/422; 427/453; 427/454
(58) Field of Search ................ 204/192.15, 192.22, 204/298.13; 420/425; 148/422; 427/453, 454

(56) References Cited

U.S. PATENT DOCUMENTS 5,354,446 A  10/1994  Kida et al. ............. 204/298.22
6,193,856 B1  2/2001  Kida et al. ............. 204/192.22

FOREIGN PATENT DOCUMENTS

| JP | 62-161945 | 7/1987 |
| JP | 03-218821 | 9/1991 |
| JP | 4-276066 | 10/1992 |
| JP | 5-214525 | 8/1993 |
| JP | 05-214526 | 8/1993 |
| JP | 05-222528 | 8/1993 |
| JP | 6-330297 | 11/1994 |
| JP | A-7-233469 | 9/1995 |
| JP | 08-283935 | 10/1996 |
| WO | WO 97/25450 A | 7/1997 |
| WO | WO 97/25451 A | 7/1997 |

OTHER PUBLICATIONS

Schuegraf, K.K., "Handbook of Thin–Film Deposition Processes and Techniques", Noyes Publications, William Andrew Publishing, LLC, Reprint Edition, p. 297 (1988).*

Chapman, B., "Glow Discharge Processes", John Wiley & Sons, p. 188 (1980).*

* cited by examiner

*Primary Examiner*—Steven H. VerSteeg
(74) *Attorney, Agent, or Firm*—Oblon, Spivak, McClelland, Maier & Neustadt, P.C.

(57) ABSTRACT

A sputtering target comprising a substrate and a target material formed on the substrate, wherein the target material comprises a metal oxide of the chemical formula $MO_x$ as the main component, wherein $MO_x$ is a metal oxide which is deficient in oxygen as compared with the stoichiometric composition, and M is at least one metal selected from the group consisting of Ti, Nb, Ta, Mo, W, Zr and Hf, a process for its production, and a method for forming a film having a high refractive index.

30 Claims, No Drawings

TARGET AND PROCESS FOR ITS PRODUCTION, AND METHOD FOR FORMING A FILM HAVING A HIGH REFRACTIVE INDEX

This application is a division of application Ser. No. 09/729,102 filed on Dec. 5, 2000, now U.S. Pat. No. 6,334,938, which is a continuation of application Ser. No. 09/011,749, filed Mar. 12, 1998, now U.S. Pat. No. 6,193,856, which is the national stage of International Application No. PCT/JP96/00767, filed Mar. 25, 1996.

TECHNICAL FIELD

The present invention relates to a target to be used for forming a transparent thin oxide film having a high refractive index by direct current (DC) sputtering, and a process for its production, and a method for forming a film having a high refractive index by using such a target.

BACKGROUND ART

Optical applications of thin oxide films start from single layer type heat reflecting glasses and antireflection films and extend to various fields including, for example, multi-layer type antireflection coatings, reflection enhancing coatings, interference filters and polarizing films, which are designed to permit lights having certain specific wavelengths to reflect or pass selectively therethrough. Further, a study has been made to insert a transparent electroconductive film or a film of e.g. metal or electroconductive ceramics having various functions such as electroconductivity and heat reflection properties as a part of a multi-layer film to obtain a multi-layer film having a function such as an antistatic, heat reflecting or electromagnetic wave shielding function provided.

The spectral characteristics of a multi-layer film are optically designed by using refractive indexes n and thicknesses of the respective layers, as parameters, and it is common to employ a combination of a high refractive index film and a low refractive index film. To realize excellent optical properties, the larger the difference in the refractive index between the high refractive index film and the low refractive index film, the better. As such a high refractive index film, titanium dioxide (n=2.4) cerium dioxide (n=2.3), zirconium dioxide (n=2.2), niobium pentoxide (n=2.1), tantalum pentoxide (n=2.1) or tungsten trioxide (n=2.0) is, for example, known. Further, as a low refractive index film, silicon dioxide (n=1.46) or magnesium fluoride (n=1.38) is, for example, known.

Such films can be formed, for example, by a vacuum vapor deposition method or a coating method. However, by such a film-forming method, it is difficult to form a uniform film over a substrate having a large area, and when a substrate having a large area, such as a glass for buildings or automobiles, CRT, or a flat display, is required, sputtering is used in many cases. Among various sputtering methods, DC sputtering utilizing direct current discharge is most suitable for forming a film over a large area. When a high refractive index film is to be formed by DC sputtering, it is common at present to employ so-called reactive sputtering wherein a metallic target having electroconductivity is subjected to sputtering in an atmosphere containing oxygen. However, there has been a problem that the film-forming speed of a thin film obtainable by this method is very slow, whereby the productivity is poor, and the cost tends to be high.

To solve such a problem, it has been proposed to use an oxide ceramic (sintered body) as a target. However, oxide ceramic usually has no electroconductivity, whereby DC sputtering has been difficult.

Further, recently, a sputtering target is required to have a complex shape, and a highly efficient planer target having the target thickness partially changed, is required. By a method for obtaining a sintered body by a common sintering method, it is difficult to produce a target having a complex structure or various shapes, and such a target is prepared by a long process including steps of mixing starting materials, sintering, processing and bonding, whereby substantial jigs are required for its production.

In sputtering over a glass sheet with a large area for buildings, the film-forming speed is increased by applying a high power for sputtering to increase the productivity, whereby cooling of the target tends to limit the film-forming speed, and further troubles such as cracking of the target, peeling, etc, are likely to occur.

A new magnetron type rotary cathode is known wherein such drawbacks have been overcome (JP-A-58-500174). This is of a type wherein a magnetic field generating means is provided inside of a cylindrical target, and sputtering is carried out while rotating the target and cooling the target from inside. By the use of such a cylindrical target, a large power per unit area can be applied as compared with a planer type target, whereby film formation at a high speed is said to be possible.

Preparation of a target material on a cylindrical target holder has heretofore been commonly carried out when the target material is a metal or alloy. In the case of a metal target, multi-layer film coatings of e.g. its oxide, nitride, carbide, etc. are formed in various sputtering atmospheres. However, it has had drawbacks that the coating films are likely to be damaged by different types of atmospheres, whereby films having desired compositions can hardly be obtainable, and, in a case of a low melting metal target, the target is likely to undergo melting when the power applied is excessive. Under these circumstances, a ceramic target material has been desired. A method has been proposed in which a ceramic sintered body is formed into a cylindrical shape and bonded to a substrate by means of indium metal. However, the method is difficult and costly.

JP-A-60-181270 proposes a process for producing a ceramic sputtering target by spraying. However, the process has had problems that the sprayed coating can not be made sufficiently thick, as the difference in thermal expansion between the ceramics and the substrate metal is large, and the adhesion tends to deteriorate by thermal shock during its use, thus leading to peeling.

JP-A-62-161945 proposes a process for producing a non-electroconductive ceramic sputtering target made of various oxides by water plasma spraying. This target is a target for radio frequency (RF) sputtering, and the target itself is an insulating material. Further, this target has had drawbacks that, unless some measures such an undercoating is taken, it is likely to undergo cracking or peeling as the temperature rises during sputtering, whereby film formation under a stabilized condition tends to be difficult. Further, there has been a drawback such that the film forming speed is very slow.

It is an object of the present invention to provide an electroconductive sputtering target which can be formed into any desired shape and which is capable of forming a high refractive index film at a high speed by DC sputtering, a process for its production, and a method for forming a high refractive index film using such a target.

DISCLOSURE OF THE INVENTION

The present invention provides a sputtering target comprising a substrate and a target material formed on the substrate, wherein the target material comprises a metal oxide of the chemical formula $MO_x$ as the main component, wherein $MO_x$ is a metal oxide which is deficient in oxygen as compared with the stoichiometric composition, and M is at least one metal selected from the group consisting of Ti, Nb, Ta, Mo, W, Zr and Hf.

The target of the present invention has electroconductivity and thus is useful for DC sputtering, whereby a uniform, transparent high refractive index film can be formed at a high speed over a large area. The target of the present invention is useful also for RF sputtering.

In a case where M in $MO_x$ of the target of the present invention is Nb and/or Ta, x is preferably within a range of $2<x<2.5$. This means that if x is 2.5, the target is electrically insulating, as it is in a completely oxidized state, whereby DC sputtering is not feasible, such been undesirable. On the other hand, if x is 2 or lower, such an oxide is chemically instable and, as such, is not desirable as a target. When $NbO_x$ is used, a high film-forming speed can be realized, and when $TaO_x$. is used, it is possible to form a film having a high corrosion resistance and high scratch resistance.

For the same reason as mentioned above, when M in $MO_x$ of the target of the present invention is Mo and/or W, x is preferably within a range of $2<x<3$, and when M in $MO_x$ in the target of the present invention is at least one metal selected from the group consisting of Ti, Zr and Hf, x is preferably within a range of $1<x<2$. Especially when $TiO_{x,i}$s used, it is possible to realize formation of a film having a very high refractive index.

The target of the present invention has electrical conductivity and thus is useful for film formation by means of DC sputtering, whereby a uniform, transparent high refractive index film can be formed at a high speed over a large area. The resistivity at room temperature of the target of the present invention is preferably at most 10 $\Omega$cm, more preferably at most 1 $\Omega$cm, so that discharge during sputtering can be carried out under a stabilized condition. If the resistivity exceeds 10 $\Omega$cm, discharge tends to be hardly stabilized.

For the target of the present invention, a composite oxide $MO_x$ employing two or more metals M, may be used so that the target will have the above mentioned characteristics simultaneously.

With the target of the present invention, the properties of the film such as the refractive index, and mechanical and chemical properties, can be changed while maintaining the high speed film formation, by adding an oxide of a metal other than metal M in $MO_x$, as an additive. As such a metal oxide, an oxide of at least one metal selected from the group consisting of Cr, Ce, Y, Si, Al and B, may be mentioned. For example, Cr is capable of imparting corrosion resistance, and Ce is capable of imparting ultraviolet ray-shielding properties.

The target of the present invention can be prepared, for example, as follows.

In a case of a $NbO_x$ target, a $Nb_2O_5$ powder is subjected to hot-pressing (high temperature and high pressure pressing) for sintering to obtain a target of the present invention. In such a case, the particle size of the powder is preferably from 0.05 to 40 $\mu$m. It is important that the atmosphere for the hot-pressing is a non-oxidizing atmosphere, and it is preferred to use argon or nitrogen, since it is thereby easy to adjust the oxygen content in the target. It is also possible to add hydrogen. The hot-pressing conditions are not particularly limited, but the temperature is preferably from 800 to 1,400° C., and the pressure is preferably from 50 to 100 kg/cm$^2$.

The present invention also provides a process for producing a sputtering target, which comprises forming an undercoat made of a metal or alloy on a substrate, and forming a ceramic layer as a target material on the undercoat, wherein the ceramic layer as a target material (hereinafter referred to simply as the ceramic layer) is formed by plasma spraying wherein a ceramic powder for spraying (hereinafter referred to simply as the ceramic powder) which is made in a semi-molten state in a high temperature plasma gas in a reducing atmosphere, is transported and deposited onto the undercoat by the plasma gas, and, as the target material, a target material comprising a metal oxide of the chemical formula $MO_x$ as the main component, is used, wherein $MO_x$ is a metal oxide which is deficient in oxygen as compared with the stoichiometric composition, and M is at least one metal selected from the group consisting of Ti, Nb, Ta, Mo, W, Zr and Hf.

In the present invention, the ceramic powder is made in a semi-molten state by means of a plasma spraying apparatus and deposited on a substrate, so that a ceramic layer for a sputtering target is directly formed.

Accordingly, the process does not require a molding step, a sintering step, a processing step to form a complex structure or shape, or a bonding step. In a case of a complicated compound which is not readily available in the form of a ceramic powder, such a compound may be chemically synthesized or may be prepared by using a solid phase reaction. The ceramic powder may be a pulverized or granulated, and further classified, so that it is adjusted to have a readily flowable particle size suitable for spraying.

The ceramic powder to be used in the present invention can be prepared by the following method. Namely, a $TiO_2$ powder having an average particle size of at most 10 $\mu$m and a powder of a metal oxide other than $TiO_2$ having an average particle size of at most 10 $\mu$m, are weighed in predetermined amounts and mixed in a wet system for at least 3 hours in a ball mill using a binder such as polyvinyl alcohol (PVA) and water as a dispersing medium, to obtain a slurry, which is then dried by a spray drier to obtain a powder having a particle size of from 10 to 100 $\mu$m, preferably from 20 to 100 $\mu$m.

In another method, ethanol is used as the above mentioned dispersing medium, and a $Nb_2O_5$ powder and a $TiO_2$ powder are mixed together with ethanol in a wet system for at least one hour by means of a ball mill in the same manner as described above, and the mixture is dried by an evaporator and then calcined in an inert atmosphere at a temperature of from 1,000 to 1,200° C., followed by classification to obtain a powder having a particle size of from 10 to 100 $\mu$m, preferably from 20 to 100 $\mu$m. The composition of this powder is reduced by calcination, but is further reduced during the subsequent plasma spraying in a reducing atmosphere.

If the particle size exceeds 100 $\mu$m, such a ceramic powder tends to be hardly made in a semi-molten state in a high temperature plasma gas, and if it is smaller than 10 $\mu$m, such a powder is likely to be dispersed in the high temperature plasma gas and thus tends to be hardly deposited on the substrate.

For the substrate, various metals or alloys, such as stainless steel, copper or titanium, may be used. Prior to the plasma spraying of a ceramic powder for the target material, it is preferred to roughen the surface of the substrate, for example, by sand blasting by means of abrasive grains made of $Al_2O_3$ or SiC in order to improve the adhesion. Otherwise, it is also preferred to process such a substrate surface to form a V-groove, followed by sand blasting by means of abrasive grains made of $Al_2O_3$ or SiC, in order to improve the adhesion.

After roughening the substrate surface, an undercoat made of a metal or alloy may be formed in order to reduce the difference in the thermal expansion between the target material to be sprayed and the substrate and to improve the adhesion so as to be durable against peeling by mechanical and thermal impacts.

As such an undercoat, a layer (hereinafter referred to as layer A) having a thermal expansion coefficient intermediate between the substrate and the target material, and/or a layer (hereinafter referred to as layer B) having a thermal expansion coefficient close to the target material, may be used. It is particularly effective to form both layers to have a structure of the substrate/layer A/layer B/ceramic layer. It is preferred to form the undercoat also by plasma spraying.

Even when the undercoat is made solely by layer A or layer B, the adhesive force of the ceramic layer to the substrate can be improved, since the metal or alloy is not brittle and has high elasticity. The thermal expansion coefficient of layer B is most suitably within a range of $\pm 2 \times 10^{-6}/°$ C. of the thermal expansion coefficient of the ceramic layer.

As the material for the undercoat, an electroconductive powder of e.g. Mo, Ti, Ni, Nb, Ta, W, Ni—Al, Ni—Cr, Ni—Cr—Al, Ni—Cr—Al—Y or Ni—Co—Cr—Al—Y may be employed. The thickness of the undercoat is preferably from 30 to 100 $\mu$m.

It is necessary to change the material for the undercoat depending upon the thermal expansion coefficient of the ceramic layer. The thermal expansion coefficient of e.g. copper or stainless steel which is useful as a substrate, is from $17 \times 10^{-6}$ to $18 \times 10^{-6}/°$ C., and the thermal expansion coefficient of titanium is $8.8 \times 10^{-6}/°$ C.

For example, for the ceramic layer (the thermal expansion coefficient: $6 \times 10^{-6}$ to $9 \times 10^{-6}/°$ C.) in the present invention, the preferred thermal expansion coefficient of the undercoat layer A is from $12 \times 10^{-6}$ to $15 \times 10^{-6}/°$ C., and as such a material, Ni, Ni—Al, Ni—Cr, Ni—Cr—Al, Ni—Cr—Al—Y or Ni—Co—Cr—Al—Y, may, for example, be mentioned.

Further, the preferred thermal expansion coefficient of the undercoat layer B is from $4 \times 10^{-6}$ to $11 \times 10^{-6}/°$ C., and as such a material, Mo, Nb, Ta, W or Ti, may, for example, be mentioned.

Further, the adhesion can be further improved by providing an undercoat layer having the composition gradually changed from a material having a thermal expansion coefficient close to the target material to a material having a thermal expansion coefficient close to the substrate, selected among such undercoat materials. Further, when the substrate is made of titanium, the undercoat may be made solely of layer B, since the thermal expansion coefficient is close thereto.

On such an undercoat, a ceramic powder which is made in a semi-molten state in a high temperature plasma gas, preferably a high temperature plasma gas such as Ar or $Ar+H_2$, in a reducing atmosphere, is transported and deposited onto the undercoat by such a gas, to form a ceramic layer which serves as a target material. In this manner, the oxide ceramic powder is reduced, and a ceramic layer comprising $MO_x$ as the main component, is obtained.

By forming the undercoat, the difference in thermal expansion between the ceramic layer and the substrate can be reduced, whereby a ceramic layer which is free from peeling even with a thickness as thick as from 2 to 10 mm, can be formed.

Also at the time of forming the undercoat, it is preferred to form it by plasma spraying in a high temperature plasma gas, preferably in a high temperature plasma gas in a reducing atmosphere, for the same reason as described above.

Further, as the plasma spraying method, water plasma spraying is more effective. This water plasma spraying is a method wherein a high pressure water stream supplied to a torch firstly forms a cylindrical eddy current at the cylindrical section, and in this state, a voltage is applied between a carbon cathode and an iron rotary anode to let direct current arcs form to evaporate and recompose water at the inner surface of the eddy current to form a plasma state thereby to generate plasma arcs continuously, and such plasma arcs are constricted by the revolving cylindrical water current to increase the energy density and eject a stabilized high temperature high speed plasma jet flame from a nozzle by rapid thermal expansion of the plasma. This spraying method provides a high energy density as compared with a gas plasma density, and a large amount of the starting material powder can thereby be sprayed all at once, whereby the target forming speed is high, and the economical efficiency is high. Further, it is thereby possible to readily form a thick film.

However, as compared with plasma spraying by a reducing gas, the reducing power is weak. Therefore, to obtain a state of $MO_x$, it is better to employ a material which is reduced at the stage of the starting material powder.

The present invention further provides a method for forming a high refractive index film employing the above described target.

A uniform transparent film can be formed at a high speed, when sputtering is carried out by using the target of the present invention in an argon atmosphere or in a mixed atmosphere of argon and small amount of $O_2$ under a pressure of from $1 \times 10^{-3}$ to $1 \times 10^{-2}$ Torr. In a case where a metal target is employed, a hysteresis phenomenon occurs which is a non-continuous change in the film forming speed or the discharge current or voltage due to change of the oxygen partial pressure. However, when the target of the present invention is employed, such a hysteresis phenomenon will not occur, and control of the film forming speed during the film formation will be very easy.

When a metal target is used for forming a metal oxide film, the film forming speed or the sputtering voltage changes abruptly and non-continuously in a hysteresis fashion due to a change of the oxygen gas partial pressure before or after the change from an absorbing film to a transparent film having the stoichiometrical composition, or before or after the change from a transparent film to an absorbing film. Accordingly, to obtain a transparent film constantly, it is necessary to introduce oxygen gas substantially excessively relative to the metal atoms.

Whereas, the target of the present invention is composed of an oxide, and is slightly deficient in oxygen as compared with the stoichiometric composition. Accordingly, film formation of a transparent metal oxide film can be carried out simply by supplementing the oxygen slightly deficient as compared with the stoichiometric composition. Besides, when the target of the present invention is employed, no change like the above mentioned hysteresis phenomenon will take place, whereby the amount of the oxygen gas to be supplied can be minimized to the required minimum or reduced to a level close to the required minimum. Thus, deposition of excess oxygen atoms on the target surface, which is believed to cause deterioration of the film forming speed, can be reduced, and the film forming speed can be increased.

When a target is produced by a spraying method as in the present invention, the oxide powder is made in a molten state and then quenched and solidified so that the sprayed material will be laminated on the substrate. At that time, crystal alignment will form in the sprayed material, since there is a difference in the crystal growth rate of crystal faces. Namely, in the face at which the surface density is low and the growth rate is high, crystallizes quickly in the direction along the substrate, and crystal alignment will necessarily form, so that the face at which the surface density is high and the growth rate is low, becomes the sputtering surface.

On the other hand, it is believed that the higher the surface density, the better the sputtering efficiency, and the higher the sputtering speed. Accordingly, this crystal alignment is believed to be one of the factors for the high film forming speed by the present invention. Further, sputtering speed is believed to be increased by numerous defective layers formed in or between grains at the time of quenching and solidification, which are susceptible to etching as compared with normal tissues.

Further, with a sputtering target thus prepared, thermal conductivity from the ceramic layer to the substrate and further to the cathode electrode, is good, and the ceramic layer is firmly bonded to the substrate. Accordingly, even when a high sputtering power is applied to increase the film forming speed, cooling can sufficiently be carried out, and peeling or cracking of the ceramic layer due to abrupt heat shock will not take place, and a large electric power per unit area can be applied.

Further, even when an erosion zone of the ceramic layer became thin, such a zone can readily be regenerated to the initial state by plasma spraying a ceramic powder of the same material to such a portion which became thin. Further, it is easy to provide a distribution in thickness of the ceramic layer depending upon any desired position, and it is thereby possible to control the thickness distribution of a thin film to be formed by providing a temperature distribution or a distribution in strength of the magnetic field at the target surface.

Further, when a cylindrical substrate is employed, the entire surface will be the erosion zone of the target, whereby there is a merit that the utilization efficiency of the target is high as compared with the planer type.

BEST MODE FOR CARRYING OUT THE INVENTION

EXAMPLE 1 TO 7

Commercially available $Nb_2O_5$ powder was filled in a hot pressing mold made of carbon, and hot pressing was carried out by maintaining it in an argon atmosphere for one hour at a temperature within a range of from 1,100° C. to 1,400° C., as identified in Table 1. At that time, the hot pressing pressure was 50 kg/cm². The density and the resistivity of the sintered product thus obtained as a target material, were measured.

Then the obtained sintered body was pulverized in an agate mortar and then heated at 1100° C. in air, whereby the weight increase was measured. Assuming that after such heating in air, the powder became completely oxidized $Nb_2O_5$, the oxygen content of the sintered body after the hot pressing was calculated from the weight increase. The results are shown in Table 1.

TABLE 1

| Example No. | Hot pressing temperature (° C.) | Density of the sintered body (g/cc) | Resistivity of the sintered body (Ωcm) | Oxygen content of the sintered body (x in $NbO_x$) |
| --- | --- | --- | --- | --- |
| 1 | 1100 | 4.00 | 0.30 | 2.498 |
| 2 | 1150 | 4.13 | 0.21 | 2.495 |
| 3 | 1200 | 4.20 | 0.15 | 2.490 |
| 4 | 1250 | 4.30 | 0.14 | 2.465 |
| 5 | 1300 | 4.36 | 0.12 | 2.465 |
| 6 | 1350 | 4.40 | 0.12 | 2.465 |
| 7 | 1400 | 4.42 | 0.12 | 2.465 |

EXAMPLES 8 TO 11

The sintered body hot-pressed at 1200° C. in Example 3, was mechanically processed to a size of 6 inch in diameter and 5 mm in thickness to obtain a target. The target was used as bonded by a metal bond to a backing plate made of copper.

This target was mounted on a magnetron DC sputtering apparatus, and film formation of a $Nb_2O_5$ film was carried out. The film formation was carried out under such conditions that the applied power was DC 1 kW, the back pressure was $1\times10^{-5}$ Torr, and the sputtering pressure was $2\times10^{-3}$ Torr. As the sputtering gas, a gas having argon and oxygen mixed in various oxygen concentration, was used. The proportion of the oxygen gas in the sputtering gas was from 10 to 40 volume %. If the oxygen is lower than 10 volume %, the film will be an absorptive film, and in order to obtain a transparent film, oxygen was required to be at least 10 volume %.

As the substrate, a soda lime glass was used. No intentional heating was applied to the substrate. The sputtering was carried out so that the film thickness would be about 100 nm. During the sputtering, the electrical discharge was very stable, and film formation was carried out under a stable condition even by DC sputtering. After the film formation, the film thickness was measured by means of a feeler type film thickness measuring apparatus. Further, the refractive index of the film was measured by an ellipsometer. The wavelength of light employed at that time, was 633 nm. The film forming speed and the refractive index of the film are shown in Table 2. All of the films obtained were transparent and showed no light absorption.

As is apparent from the results in Table 2 by using the target of the present invention, a transparent $Nb_2O_5$ film having a high refractive index was formed at a high speed.

COMPARATIVE EXAMPLES 1 TO 3

As Comparative Example 1, using a metal titanium target instead of the target of Example 8, film formation by sputtering was carried out in the same manner. The proportion of oxygen gas in the sputtering gas was 30 volume %. In the case of a titanium target, if oxygen is lower than 30 volume %, the film becomes an absorptive film, and in order to obtain a transparent film, oxygen was required to be at least 30 volume %. Accordingly, sputtering was carried out at an oxygen concentration of 30 volume % which was the oxygen proportion at which a transparent film could be obtained and the film forming speed was highest.

Further, as Comparative Example 2, using a metal niobium target instead of the target of Example 8, film formation by sputtering was carried out in the same manner. In the case of metal niobium target, the sputtering was carried out at an oxygen concentration of 30 volume % for the same reason as mentioned above.

As Comparative Example 3, using a titanium monoxide (TiO) target (density: 4.90 g/cc, resistivity: $3.0 \times 10^{-4}$ Ωcm, oxygen content: 25.0 wt %), film formation by sputtering was carried out in the same manner. In the case of the TiO target, if oxygen is lower than 20%, the film becomes absorptive, and in order to obtain a transparent film, oxygen was required to be at least 20%. Accordingly, sputtering was carried out by selecting a case of the oxygen proportion of 20% at which the film formation speed was highest.

As is evident from the results in Table 2, the film forming speeds for transparent $Nb_2O_5$ and $TiO_2$ in Comparative Examples 1 to 3, were inferior as compared with the cases in which targets of the present invention were used.

TABLE 2

| | Target | Oxygen content in the sputtering gas (volume %) | Film forming speed (nm/min) | Refractive index |
| --- | --- | --- | --- | --- |
| Example 8 | $NbO_x$ | 10 | 85 | 2.3 |
| Example 9 | $NbO_x$ | 20 | 70 | 2.3 |
| Example 10 | $NbO_x$ | 30 | 40 | 2.3 |
| Example 11 | $NbO_x$ | 40 | 30 | 2.3 |
| Comparative Example 1 | Ti | 30 | 6 | 2.4 |
| Comparative Example 1 | Nb | 30 | 13 | 2.3 |
| Comparative Example 1 | TiO | 20 | 7 | 2.4 |

EXAMPLES 12 TO 15

To commercially available $Nb_2O_5$ powder, an oxide of Cr, Ce, Al or Si was added in a proportion (oxide/oxide+$Nb_2O_5$) as identified in Table 3 and mixed with the $Nb_2O_5$ powder in a ball mill. Such a powder mixture was filled into a hot pressing mold made of carbon, and hot pressing was carried out under the same conditions as in Example 3 to obtain a sintered body. With respect to each sintered body, the density and resistivity were measured in the same manner as in Examples 1 to 7. The results are shown in Table 3. Such a sintered body was formed into a target in the same manner as in Example 8, and film formation by sputtering was carried out, whereby the film forming speed was from 30 to 90 nm/min, and the refractive index was 2.3.

Further, a part of each sintered body was subjected to acid dissolution or alkali fusion to obtain its aqueous solution, and the composition of the sintered body was analyzed by an ICP apparatus whereby it was confirmed that the composition of the charged powder mixture and the composition of the sintered body were substantially in agreement.

TABLE 3

| Example No. | Additive | Amount of the additive (wt %) | Density of the sintered body (g/cc) | Resistivity of the sintered body (Ωcm) |
| --- | --- | --- | --- | --- |
| 12 | $Cr_2O_3$ | 20 | 4.52 | 0.45 |
| 13 | $CeO_2$ | 20 | 4.70 | 0.30 |
| 14 | $Al_2O_3$ | 5 | 4.42 | 0.20 |
| 15 | $SiO_2$ | 5 | 4.21 | 0.20 |

EXAMPLE 16

By changing $NbO_x$ in Example 3 to $TaO_x$ (x=2.470), the operation was carried out in the same manner as in Examples 8 to 11 and Examples 12 to 15, whereby similar good results were obtained.

Further, by changing $TaO_x$ (x=2.470) to $MoO_x$ (x=2.950), $WO_x$ (x=2.955), $ZrO_x$ (x=1.995, and 8 mol % of $Y_2O_3$ was added) and $HfO_x$ (x=1.995), respectively, the operations were carried out in the same manner, and similar good results were obtained.

EXAMPLE 17

High purity $TiO_2$ powder (average particle size: at most 10 μm) was mixed in a wet system for 3 hours in a ball mill using PVA binder and water as a medium, and the obtained slurry was granulated by means of a spray drier to obtain a ceramic powder having a particle size of from 20 to 100 μm.

Using a copper planer having a diameter of 6 inches as a target metal holder, the outer surface was roughened by sand blasting by means of $Al_2O_3$ abrasive grains to obtain a roughened surface.

Then, an alloy powder of Ni—Al (weight ratio of 8:2) was plasma-sprayed (using a metoko sprayer) under a reducing atmosphere to form an undercoat layer A having a thickness of 50 μm. This plasma spraying under a reducing atmosphere was carried out using Al+$H_2$ gas as the plasma gas at a flow rate of 42.5 l/min by applying a power of 35 kV at 700 A to instantaneously heat the alloy powder of Ni—Al by the Ar+$H_2$ gas plasma of from 10,000 to 20,000° C. and to transport the alloy powder together with the gas onto the target metal holder to let it solidify thereon. The coating film was formed by repeating an operation of moving the plasma spraying gun right and left and up and down.

Then, using a Ti metal powder, plasma spraying was carried out in the same manner as above to form an undercoat layer B having a thickness of 50 μm. Further, using the above mentioned ceramic powder, plasma spraying was carried out under the same reducing atmosphere to form a ceramic layer having a final thickness of 5 mm.

The ceramic layer of the obtained target was cut out from the metal substrate, and the density and the resistivity were measured. Further, the obtained ceramic layer was pulverized in an agate mortar and heated to 1100° C. in air, whereby the weight increase was measured. Assuming that after the heating in air, the powder became completely oxidized $TiO_2$, the oxygen content of the ceramic layer was calculated from the weight increase. The results are shown in Table 4.

TABLE 4

| | Density (g/cc) | Resistivity (Ωcm) | x in TiO$_x$ |
|---|---|---|---|
| Example 17 | 4.07 | 0.33 | 1.93 |

EXAMPLES 18 TO 21

The target of Example 17 was mounted on a magnetron sputtering apparatus, and film formation of a TiO$_2$ film was carried out by changing the O$_2$ proportion in the sputtering gas as shown in Table 5. As the sputtering gas, Ar or a gas mixture of Ar and O$_2$, was used. The sputtering was carried out under such conditions that the applied power was DC 1 kW, the back pressure was $1 \times 10^{-5}$ Torr, and the sputtering pressure was $2 \times 10^{-3}$ Torr. As the substrate, a soda lime glass was used, and no intentional heating was applied to the substrate. The sputtering was carried out so that the film thickness would be about 100 nm. During the sputtering, the discharge was very stable, and film formation was carried out under a stabilized condition even by DC sputtering.

After the film formation, the refractive index of the film was measured by an ellipsometer (the wavelength of light used was 633 nm). The film forming speed and the refractive index of the film are shown in Table 5. All of the obtained films were transparent and showed no light absorption.

TABLE 5

| | Target | Oxygen propotion in the sputtering gas (%) | Film-forming speed (nm/min) | Refractive index |
|---|---|---|---|---|
| Example 18 | TiO$_x$ | 0 | 60 | 2.4 |
| Example 19 | TiO$_x$ | 10 | 30 | 2.4 |
| Example 20 | TiO$_x$ | 20 | 20 | 2.4 |
| Example 21 | TiO$_x$ | 30 | 10 | 2.4 |

EXAMPLES 22 TO 25

Commercially available high purity TiO$_2$ powder and an oxide powder as identified in Table 6 as an additive were mixed, so that the amount of the additive was as shown in Table 6. From such a powder, a ceramic powder was prepared in the same manner as in Example 17, and plasma spraying was carried out in the same manner as in Example 17 to obtain a target having a ceramic layer having a thickness of 5 mm. The density and resistivity of the obtained ceramic layer were measured, and results are shown in Table 6.

A part of the ceramic layer constituting a target material was subjected to acid dissolution or alkali fusion to obtain its aqueous solution, and the composition of the sintered body was analyzed by an ICP apparatus, whereby it was confirmed that the composition of the charged powder mixture and the composition of the sintered body were substantially in agreement.

Further, with respect to the obtained target, film formation of TiO$_2$ film was carried out in the same manner as in Examples 18 to 21. During the sputtering, the discharge was very stable, and film formation was carried out under a stabilized condition even by DC sputtering. The film-forming speed and the refractive index of the films were the same as in Examples 18 to 21, and all of the obtained films were transparent and showed no light absorption.

TABLE 6

| Example No. | Additive | Amount of the additive (wt %) | Density of the sintered body (g/cc) | Resistivity of the sintered body (Ωcm) |
|---|---|---|---|---|
| 22 | Cr$_2$O$_3$ | 20 | 4.30 | 0.62 |
| 23 | CeO$_2$ | 20 | 4.41 | 0.61 |
| 24 | Al$_2$O$_3$ | 5 | 4.09 | 0.22 |
| 25 | SiO$_2$ | 5 | 4.01 | 0.15 |

EXAMPLE 26

In Example 17, instead of using the copper plate having a diameter of 6 inches as a target metal holder and roughening its outer surface by sand blasting by means of Al$_2$O$_3$ abrasive grains to a roughened surface, a copper cylindrical target holder having an inner diameter of 50.5 mm, and outer diameter of 67.5 mm and a length of 406 mm, was attached to a lathe, and its outer surface side was threaded and further surface roughened by sand blasting by means of Al$_2$O$_3$ abrasive grains to form a roughened surface, and otherwise, in the same manner as in Example 1, a target was prepared. And, in the same manner as in Example 17, the density, the resistivity and the oxygen content of the ceramic layer of the target were measured. The results were the same as in Example 17.

EXAMPLE 27

Film formation of a TiO$_2$ film was carried out in the same manner as in Example 18 to 21 except that the targets in Examples 18 to 21 were used as the target of Example 26.

During the sputtering, the discharge was very stable, and film formation was carried out under a stabilized condition even by DC sputtering. Further, all of the obtained films were transparent and showed no light absorption.

The film-forming speed and the refractive indexes of the films were the same as in Examples 18 to 21.

EXAMPLE 28

A target was prepared in the same manner as in Example 17 except that in Example 17, the obtained ceramics powder was heat-treated at 1,000° C. in an inert atmosphere to obtain a reduced powder, and the ceramic layer was formed by water plasma spraying. The density and the resistivity of the ceramic layer of the obtained target were the same as in Example 17. Further, the oxygen content was examined in the same manner as in Example 17 and found to be the same as in Example 17. The ceramic layer-forming time in a case where the ceramic layer of the target was 5 mm in thickness, is shown in Table 7 as compared with Example 17.

TABLE 7

| | Ceramics layer-forming time (hrs) |
|---|---|
| Example 17 | 2.5 |
| Example 28 | 0.3 |

INDUSTRIAL APPLICABILITY

By using the sputtering target of the present invention, a transparent film having a high refractive index can be formed at a high speed by DC sputtering. Further, with the target of the present invention, the oxygen partial pressure of the sputtering atmosphere can be reduced, thus providing a merit that abnormal discharge such as arcing can be reduced. Accordingly, by using the target of the present invention, a film having a high refractive index can be produced at a high speed and under a stabilized condition.

The target prepared by the process of the present invention is uniform, highly dense and strong against thermal shock. According to the process of the present invention, a target having an optional shape can easily be produced without requiring conventional shaping, sintering, processing or bonding step.

Further, with the sputtering target of the present invention, the target can be regenerated by plasma spraying a spraying powder of fresh target material having the same composition to a consumed portion after use, such being economically advantageous.

Further, in a case of a Ti type $MO_x$, a photocatalytic function is expected, and a film capable of imparting an antibacterial, antifouling or drip flowing property to a substrate surface of glass or other than glass such as plastic, can be formed at a high speed.

By using the sputtering target of the present invention, the cooling effect during the sputtering is high, whereby even if the sputtering power is increased, cracking or breakage of the target will not take place, and film forming at a high speed can be carried out under a stabilized condition at a low temperature. Thus, the productivity of not only display elements or CRT but also large surface glasses for buildings or automobiles, can remarkably be improved.

Further, even on a substrate made of e.g. plastic which is susceptible to the influence of radiant heat from the target, high speed film forming can be carried out without damaging the substrate.

What is claimed is:

1. A sputtering target comprising a substrate and a target material formed on the substrate, wherein
   the target material comprises as a main component an oxygen deficient oxide; and
   the oxygen deficient oxide comprises a metal oxide of a chemical formula $NbO_x$ where $2<x<2.5$, wherein
   the target material has a resistivity of at most 10 Ωcm at room temperature.

2. The sputtering target according to claim 1, wherein the target material has a resistivity of at most 1 Ωcm at room temperature.

3. The sputtering target according to claim 1, produced by a plasma spraying process.

4. The sputtering target according to claim 1, wherein the substrate is a surface-roughened substrate.

5. The sputtering target according to claim 1, wherein the substrate is a cylindrical substrate.

6. A method of making a sputtering target, the method comprising
   forming a target material by plasma spraying a ceramic powder in a semi-molten state in a high temperature plasma gas in a reducing atmosphere onto a substrate, wherein
   the target material comprises as a main component an oxygen deficient oxide; and
   the oxygen deficient oxide comprises a metal oxide of a chemical formula $NbO_x$ where $2<x<2.5$.

7. The method according to claim 6, further comprising forming an undercoat made of metal or alloy between the substrate and the target material.

8. The method according to claim 7, wherein the undercoat is at least one of
   a layer having a thermal expansion coefficient intermediate between a thermal expansion coefficient of the target material and a thermal expansion coefficient of the substrate and
   a layer having a thermal expansion coefficient close to the thermal expansion coefficient of the target material.

9. The method according to claim 7, wherein the plasma spraying is water plasma spraying.

10. A method for forming a film, the method comprising sputtering a target, wherein
    the sputtering target comprises a substrate and a target material formed on the substrate;
    the target material comprises as a main component an oxygen deficient oxide; and
    the oxygen deficient oxide comprises a metal oxide of a chemical formula $NbO_x$ where $2<x<2.5$.

11. The method according to claim 10, wherein the sputtering is DC sputtering.

12. The method according to claim 10, wherein the target has a resistivity of at most 10 Ωcm.

13. The method according to claim 10, wherein the sputtering is carried out in an argon atmosphere or in a mixed atmosphere of argon and oxygen.

14. The method according to claim 13, wherein the mixed atmosphere of argon and oxygen comprises at least 10 vol % oxygen.

15. The method according to claim 10, further comprising forming a film having a refractive index of 2.3.

16. A sputtering target comprising
    a substrate;
    a target material formed on the substrate; and
    an undercoat of a metal or alloy between the target material and the substrate, wherein
    the target material comprises as a main component an oxygen deficient oxide; and
    the oxygen deficient oxide comprises a metal oxide of a chemical formula $NbO_x$ where $2<x<2.5$.

17. The sputtering target according to claim 16, wherein the substrate is a cylindrical substrate.

18. The sputtering target according to claim 16, wherein the substrate is a surface-roughened substrate.

19. The sputtering target according to claim 16, wherein the undercoat has a thermal expansion coefficient between a thermal expansion coefficient of the target material and a thermal expansion coefficient of the substrate.

20. The sputtering target according to claim 19, wherein the thermal expansion coefficient of the undercoat is from $12 \times 10^{-6}$ to $15 \times 10^{-6}/°$ C.

21. The sputtering target according to claim 16, wherein the undercoat comprises
    a first layer, which is adjacent to the substrate and which has a thermal expansion coefficient between the thermal expansion coefficient of the target material and the thermal expansion coefficient of the substrate; and
    a second layer, which is adjacent to the target material and which has a thermal expansion coefficient within a range of $\pm 2 \times 10^{-6}/°$ C. of a thermal expansion coefficient of the target material.

22. The sputtering target according to claim 16, wherein the undercoat comprises a material selected from the group consisting of Mo, Ti, Ni, Nb, Ta, W, Ni—Al, Ni—Cr, Ni—Cr—Al, Ni—Cr—Al—Y and Ni—Co—Cr—Al—Y.

23. The sputtering target according to claim 16, wherein the undercoat has a thickness of from 30 to 100 μm.

24. The sputtering target according to claim 16, wherein the undercoat has a thermal expansion coefficient within a range of $\pm 2\times 10^{-6}/°$ C. of a thermal expansion coefficient of the target material.

25. The sputtering target according to claim 24, wherein the thermal expansion coefficient of the undercoat is from $4\times 10^{-6}$ to $11\times 10^{-6}/°$ C.

26. The sputtering target according to claim 16, wherein the target material has a thickness of from 2 to 10 mm.

27. The sputtering target according to claim 16, wherein the target has a resistivity of at most 10 Ωcm.

28. A method of making a sputtering target, the method comprising providing an undercoat on a substrate;

depositing a target material on the undercoat; and forming the sputtering target of claim 16.

29. The method of claim 28, wherein the depositing comprises plasma spraying.

30. A method of using a sputtering target, the method comprising sputtering the sputtering target of claim 16.

* * * * *